United States Patent
Ohkawa

[19]

[11] Patent Number: 6,106,683
[45] Date of Patent: *Aug. 22, 2000

[54] GRAZING ANGLE PLASMA POLISHER (GAPP)

[75] Inventor: Tihiro Ohkawa, La Jolla, Calif.

[73] Assignee: Toyo Technologies Inc., La Jolla, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/880,778

[22] Filed: Jun. 23, 1997

[51] Int. Cl.[7] ................ C23F 1/02; H05H 1/46
[52] U.S. Cl. ............. 204/298.36; 204/298.34; 204/192.32; 156/345; 216/67
[58] Field of Search ........... 204/298.31, 298.08, 204/298.32, 298.33, 298.34, 298.36, 298.38, 192.12, 192.32, 298.37, 192.13, 298.03, 192.37; 156/345; 216/59, 67, 68, 70

[56] References Cited

U.S. PATENT DOCUMENTS

| | | | |
|---|---|---|---|
| 3,699,334 | 10/1972 | Cohen et al. | 204/298.32 |
| 4,371,412 | 2/1983 | Nishizawa | 204/298.34 |
| 4,375,385 | 3/1983 | Halon | 204/192.32 |
| 4,381,965 | 5/1983 | Maher, Jr. et al. | 156/345 P |
| 4,479,848 | 10/1984 | Otsubo et al. | 204/298.32 |
| 4,500,409 | 2/1985 | Boys et al. | 204/298.03 |
| 4,639,301 | 1/1987 | Doherty et al. | 204/298.32 |
| 4,687,539 | 8/1987 | Burns et al. | 204/298.32 |
| 4,704,301 | 11/1987 | Bauer et al. | 204/298.34 |
| 4,734,158 | 3/1988 | Gillis | 204/298.32 |
| 4,780,682 | 10/1988 | Politzer . | |
| 5,016,663 | 5/1991 | Mase et al. | 204/298.32 |
| 5,047,115 | 9/1991 | Charlet et al. | 204/192.37 |
| 5,200,023 | 4/1993 | Gifford et al. | 204/298.32 |
| 5,217,560 | 6/1993 | Kurono et al. | 156/345 C |
| 5,225,740 | 7/1993 | Ohkawa . | |
| 5,279,669 | 1/1994 | Lee | 204/298.37 |
| 5,328,555 | 7/1994 | Gupta | 204/298.32 |
| 5,350,454 | 9/1994 | Ohkawa . | |
| 5,361,016 | 11/1994 | Ohkawa et al. . | |
| 5,453,305 | 9/1995 | Lee | 204/298.37 |
| 5,540,781 | 7/1996 | Yamagami et al. | 204/298.34 |
| 5,556,501 | 9/1996 | Collins et al. | 156/345 C |
| 5,571,576 | 11/1996 | Quin et al. | 204/192.37 |
| 5,707,486 | 1/1998 | Collins | 156/345 |
| 5,795,452 | 8/1998 | Kinoshita et al. | 204/298.34 |

*Primary Examiner*—Nam Nguyen
*Assistant Examiner*—Gregg Cantelmo
*Attorney, Agent, or Firm*—Nydegger & Associates

[57] ABSTRACT

A device and method for polishing the surface of a substrate uses a vessel for holding a plasma in a magnetic field. Further, the magnetic field is selectively oriented in the vessel relative to the substrate surface. An ion accelerator is then activated to accelerate ions from the plasma on a curved path toward the substrate. By controlling the strength of the magnetic field, and the r-f power and frequency needed to accelerate the ions, the accelerated ions are sent on the curved path for collision with the substrate surface. These collisions, which occur at grazing angles in the range of 0°–20°, remove atoms from the substrate surface and thereby polish the surface.

27 Claims, 3 Drawing Sheets

GRAZING ANGLE PLASMA POLISHER (GAPP)

FIELD OF THE INVENTION

The present invention pertains generally to apparatus and methods for polishing surfaces. More particularly, the present invention pertains to apparatus and methods for polishing surfaces by ion sputtering. The present invention is particularly, but not exclusively, useful for polishing the surface of a substrate to smooth the surface for industrial and fabrication purposes.

BACKGROUND OF THE INVENTION

Quite apart from the general notion of polishing as a means for enhancing the beauty of an object, polishing operations are also used in a variety of industrial fabrication processes. The fabrication of semiconductor integrated circuits and the fabrication of optical surfaces are good examples where polishing operations are required to enhance the functionality of the finished product.

As is well known, semiconductor integrated circuits are fabricated on a silicon wafer in multiple layers using plasma assisted deposition/etching processes. Typically, after each layer has been fabricated, the surface of the top layer is polished flat so that the next layer can be fabricated without interference from preexisting surface irregularities. Plasma assisted etchback and chemical mechanical polishing (CMP) are two processes which have been previously employed for this purpose. It is known, however, that, the etchback process cannot make a surface truly flat. This is because etchback processes tend to take off the same amount of material equally over the entire surface of the material; without regard to the surface contour of the material. Consequently, the more pronounced surface irregularities are not removed.

Although for some applications CMP may be more effective than plasma assisted etchback, the CMP process requires the use of a separate environment from the one used for the plasma assisted deposition/etching process. As a result, CMP is a time consuming process due to the fact there is a need to change environments for each polishing of the substrate. Furthermore, an inability to measure the progress of CMP polishing makes CMP a generally hit and miss operation. Also, the mechanical polishing of a surface with abrasives does not result in a very smooth surface finish, and any contamination of the surface caused by abrasive materials or chemicals used for polishing is an important concern.

In a departure from known polishing processes the present invention recognizes that plasmas can be created and controlled to perform a polishing action that is separate and distinct from the now familiar deposition and etching operations. In the present invention, the plasma ions are accelerated and made to impact the substrate at a grazing angle. The sputtering, due to the ion impact at a grazing angle, removes the substrate atoms preferentially from protruding surface morphology and thus polishes the surface. To appreciate this departure, some technical information is helpful. Specifically, it is helpful to consider a sputtering process in which atoms are removed from a surface by the bombardment of positive ions, and the effect which a magnetic field can have on directing the acceleration of ions into collision with the surface.

It is well known that the sputtering yields of ions depend on both their mass and their energy. It is also known that variations in a sputtering process due to changes in the substrate materials are minor. Insofar as the mass of the ions are concerned, the yields from ions of the heavier noble gases, such as Ne, Ar, Kr and Xe, are practically the same at any given energy. It turns out, however, that the sputtering yields of lighter ions, such as He and H, are at least one order of magnitude smaller than those of the heavier ions. Accordingly, for purposes of the present invention, the sputtering yields of these lighter ions are onsidered negligible.

Insofar as the energy level of ions in a sputtering operation is concerned, it happens that once the ion energy level is above a threshold energy $W_c$ ($W_c$ is approximately 30 eV), the sputtering yield increases rapidly with further increases in the ion energy W. After a rather rapid increase, the sputtering yield plateaus around 10 keV. For the energy range of interest for the present invention, e.g. 30 eV–300 eV, the experimental data of the sputtering yield, Y, of the heavier ions can be fitted with a formula given by:

$$Y = \{W[eV] - W_c[eV]\}/270 \ eV \quad [1]$$

As shown by formula [1], the yield reaches unity around an ion energy of 300 eV.

Unlike other sputtering processes, the present invention requires that ions move along predetermined paths, or trajectories. To do this, the present invention makes use of the fact that any particle of charge e moving with a velocity v perpendicular to a magnetic field of flux density B, moves in a circular path. Thus, for a uniform magnetic field of substantially constant field strength B in the z-direction, the motion of an ion in the x-y plane under the influence of an r-f electric field E is given by the formula:

$$E_y = E \cos[\Omega t + \phi] \quad [2]$$

Where:

$$\Omega = eB/M \quad [3]$$

In formulae [2] and [3], $\phi$ is the phase of the r-f electric field at t=0, and $\Omega$ is the cyclotron angular frequency which is equal to $2\pi$ times the number of revolutions an ion makes around the z-directed path per second. M is the mass of the ion.

The equations of motion of an ion with mass M are then given by the expressions:

$$M dv_x/dt = ev_y B$$

$$M dv_y/dt = eE_y - ev_x B \quad [4]$$

Initially, as an ion is created from a gas atom by ionization, its velocity is negligibly small. Accordingly, we can assume that the velocity is zero at t=0. From this initial condition, when the ion is accelerated by an r-f signal, we obtain $$v_x = [eEt/2M]\sin[\Omega t + \phi] - [eE/2M\Omega]\sin\phi \sin\Omega t$$

$$v_y = [eEt/2M]\cos[\Omega t + \phi] + [eE/2M\Omega]\cos\phi \sin\Omega t \quad [5]$$

After a few cycles the second terms become small compared to the first terms and the velocities are approximately equal to $$v_x \approx [eEt/2M]\sin[\Omega t + \phi]$$

$$v_y \approx [eEt/2M]\cos[\Omega t + \phi] \quad [6]$$

From these equation it can be appreciated that the ion is a spiral in which both the magnitude of the velocity v and the gyro-radius $\rho$ of the ion increase linearly with time. These variables are calculated with the following formulas:

$$v=[eEt/2M]$$

$$\rho=[Et/2B] \qquad [7]$$

Because the ions are accelerated along an outwardly expanding spiral path, if two plates are placed at y=0 and y=h, the ions are lost when their orbits intersect either of these plates. The ions born between y=0 and y=h/2 reach the bottom plates and the ions born between y=h/2 and y=h reach the top plate. The ions produced at $y=y_o$ reach the plate in the period $\tau$ given by $$\tau = 2By_o/E \qquad h/2 > y_o > 0 \qquad [8]$$
$$\tau = 2B[y_o - h/2]/E \qquad h > y_o > h/2$$

Depending on where they are born, the velocity of the ions as they strike the plates will range from 0 to $v_m=\Omega h/2$, and their energy will vary from 0 to a value for $W_m=e^2B^2h^2/[8M]$.

Using the sputtering yield as a function of the energy (see [1] above) the average yield <Y> is calculated with the expression:

$$<Y>=\int Ydv/v_m \qquad [9]$$

From this we obtain:

$$<Y>=[\tfrac{1}{3}][W_m+\sqrt{W_mW_c}-2W_c][1-W_c/W_m]/270 \text{ eV} \qquad [10]$$

For example, if $W_m$=300 eV and Wc=3-eV the average yield is 0.37.

As the orbiting ions approach the substrate surface, the closest point in their respective trajectories move closer to the substrate surface in steps. During each cyclotron cycle the gyroradius increases by $\Delta\rho$ which is given by the equation:

$$\Delta\rho=[\pi E/B\Omega] \qquad [11]$$

Due to the increasing $\Delta\rho$, depending on where the ion is born, the ion impact angle ($\theta$) will vary. In this context, $\theta$ is the angle between the path of the ion and the surface of the substrate. For example, if the closest point in the ion path is just $\Delta\rho$ away from the surface on a particular pass, the ion will strike the surface tangentially on the next pass. On the other hand, if the orbiting ion just misses the surface on a pass the ion will intersect the surface with the maximum angle $\theta$ on the next pass. The range of the angle $\theta$ between the direction of the ion motion at the impact and the surface is given by the expression:

$$1>\cos\theta>[1+\Delta\rho/\rho]^{-1} \qquad [12]$$

By assuming $\theta$ is small, we obtain the expression:

$$0<\theta^2<2\Delta\rho/\rho \qquad [13]$$

For ions having maximum energy, equation [13] becomes:

$$0<\theta^2<[4\pi E/B\Omega h] \qquad [14]$$

For example, with B=0.3T, $\Omega$-7.5×10$^5$ sec$^{-1}$, h=0.1 m and E=200 V/m the angle ranges between 0 and 19 degrees.

So far we have assumed that the frequency for accelerating the ions is the frequency required for ion cyclotron resonance heating (ICRH). Also, it has been assumed that this frequency is maintained exactly equal to the cyclotron frequency of the ions. It happens, however, that when the frequency of the r-f excitation is slightly detuned, or moved off resonance, the phase of the ion orbits will slip with each succeeding cycle. As the phase slips, the velocity of the ions initially increases. Then after enough phase slippage has accumulated, the velocity decreases. It turns out there are advantages to be gained by employing the slightly detuned r-f frequency. Primarily, by using detuning techniques, the acceleration rate of the ions can be reduced as their orbits come close to the plates. This reduced acceleration translates into a reduced angle $\theta$ at the point of impact.

For purposes of the present invention, the ICRH field can be determined with the following formula:

$$E_y=E\cos[\omega t+\phi] \qquad [15]$$

In formula [15], $\omega$ is the r-f angular frequency. When the r-f angular frequency is off resonance by $\Delta\omega$, the expression is:

$$\omega=\Omega+\Delta\omega \qquad [16]$$

With an off-resonance r-f angular frequency, the velocities of the ion are given by the expressions:

$$v_x = -2\Omega[eE/M][\Omega^2-\omega^2]^{-1}\{\sin[\Omega t+\Delta\omega t/2+\phi]\sin[\Delta\omega t/2] - \qquad [17]$$
$$[\Delta\omega/2\Omega]\sin\phi\sin\Omega t\}$$

$$v_y = -2\omega[eE/M][\Omega^2-\omega^2]^{-1}\{\cos[\Omega t+\Delta\omega t/2+\phi]\sin[\Delta\omega/2] +$$
$$[\Delta\omega/2\Omega]\cos\phi\sin\Omega t\}$$

By ignoring small terms in the expression [17] we obtain:

$$v_x \approx [eE/M\Delta\omega]\sin[\Omega t+\Delta\omega t/2+\phi]\sin[\Delta\omega t/2]$$
$$v_y \approx [eE/M\Delta\omega]\cos[\Omega t+\Delta\omega\phi t/2+]\sin[\Delta\omega t/2] \qquad [18]$$

From the above expressions [18] it can be seen that the magnitude of the velocity oscillates and does not increase indefinitely. This is unlike the case where $\Delta\omega$=0.

When using the above expressions for the velocities of the ions, and under the condition where $\Delta\omega\approx 0$, the gyro-radius and its rate of increase becomes $$\rho=[E/B\Delta\omega]\sin[\Delta\omega t/2]$$
$$d\rho/dt=[E/2B]\cos[\Delta\omega t/2] \qquad [19]$$

It can be noted that at the limit of $\Delta\omega$=0, the above equations are identical to eq[5], eq[6] and eq[7]. With this in mind, the condition that all the ions reach the plates is given by:

$$\Delta\omega<[hB/2E] \qquad [20]$$

The increase of the gyro-radius in one cycle and the range of the impact angle are respectively given by the expressions:

$$\Delta\rho/\rho=\pi\{[E/Bv]^2-[\Delta\omega/\Omega]^2\}^{1/2} \qquad [21]$$

$$0<\theta^2<2\pi\{[E/Bv]^2-[\Delta\omega/\Omega]^2\}^{1/2} \qquad [22]$$

Upon comparing the above expressions with eq [11] and eq [12], it will be appreciated that an appropriate amount of detuning can be effective in reducing the angle of impact $\theta$. As contemplated for the present invention, the detuning is accomplished by changing either the frequency of the r-f electric field or the strength of the magnetic field.

Because ICRH increases only the perpendicular velocity of the ions (i.e. velocity components in the x-y plane), the ions move along the magnetic field lines in the z direction at their thermal velocity $v_{th}$. The condition that the ions strike the substrate before leaving the region in the z-direction is given by the following formula:

$$\tau < L_z/[2V_{th}] \quad [23]$$

where $L_z$ is the length of the region in z-direction. By using eq [8] given above, we obtain:

$$E > [hB/L_z][2kT/M] \quad [24]$$

where T is the gas temperature. For example with h=0.1 m, B=0.3T, T=500° K. and argon gas, the above condition becomes E>45 V/m.

A concern for the accelerated ions is that they may collide with gas atoms during their acceleration. If this happens, the collisions will destroy the synchronism between the ion orbits and the r-f field. These collisions may also change the angle θ at which the ions impact on the plates. Therefore, it is important to accelerate the ions at a rate which will avoid the collisions. The rate at which the ions can be accelerated and reach the substrate without suffering the collisions is given by the following formula $$n_o \sigma_1 W/(eE) < 1 \quad [25]$$

where $n_o$ is the density of gas atoms and $\sigma_1$ is the collision cross-section. For example, $\sigma_1 = 6 \times 10^{-20}$ m$^2$, W=300 eV and E=200 V/m results in $n_o < 1.1 \times 10^{19}$ m$^{-3}$ 13=3×10$^{-4}$ Torr.

Thus far we have considered the acceleration of ions in a magnetic field due to ICRH. For the present invention, however, not all ions in the plasma are to be accelerated by ICRH. Instead, only ions from a minority gas in a gas mixture are to be so accelerated. The plasma ions are a mixture of the majority ions and the minority ions. The minority ions will be from a different gas than the majority ions, and both will be generated by a process which is commonly known as electron cyclotron heating (ECH).

Plasma production by ECH is well known. Typically, for ECH, a microwave is radiated into a gas or gas mixture which is contained within a vessel chamber. This can be done with antennas having multiple slots. With this radiation, electrons are heated by electron cyclotron resonance. Gas atoms are then ionized by the electrons and the resultant plasma is maintained in the vessel chamber by ECH power. Because of its high efficiency ECH is known to be capable of maintaining plasmas at a low neutral gas pressure. In the particular geometry envisioned for the present invention, due to the presence and orientation of the magnetic field, the plates which hold the substrates are magnetically insulated from the plasma, and the main plasma loss is to the vessel walls along the magnetic field lines. Under these conditions, the required ECH power $P_{ec}$ to balance the plasma loss to the walls is given by the expression:

$$P_{ec} = 1.2 \times L_z h n_e [T_e/M_i]^{1/2} Q_i \quad [26]$$

where $L_z$ is the length of the plasma in the x-direction, $n_e$ is the electron density, $t_e$ is the electron temperature, $M_i$ is the mass of the majority ions and $Q_i$ is the energy required to ionize the atom including the excitation loss prior to the ionization. For helium plasma with $T_e$=5 eV, $Q_i$=80 eV, $L_z$=0.4 m and H=0.1 m the expression [26] becomes:

$$P_{ec} = 6.8 \times 10^{-15} n_e \quad [27]$$

To achieve the density of $10^{17}$ m$^{-3}$, the required power is 680 watt.

As mentioned above, Ion cyclotron resonance heating (ICRH) is a mode for heating a plasma by resonant absorption of energy based on the waves inducted in the plasma at the cyclotron frequency of the ions. Because the ICRH frequency of the minority ions is lower than the cyclotron frequencies of both the electrons and the majority ions, the plasma oscillates in the x-direction in response to the ICRH field in the y-direction. The velocity of this oscillation $u_x$ is given by $$u_x = E_y/B = [E/B]\cos[\Omega t + \phi] \quad [28]$$

Because of their non-negligible mass, the majority ions move in the y-direction at the velocity $u_y$ given by $$u_y = [-\Omega/\Omega_i]E \sin[\Omega t + \phi] \quad [29]$$

where $\Omega_i$ is the angular cyclotron frequency of the majority ions. This response is out of phase with respect to the field and is, therefore, capacitive. In this case the capacitance C of the plasma is given by the expression:

$$C = [nM_i/B^2][L_x L_z/h] \quad [30]$$

where $M_i$ is the mass of the majority ions. The capacitive impedance $Z_c$ thus becomes $$Z_c = [M/M_i][B/en][h/L_x L_z] \quad [31]$$

For example, M/M$_i$=10, B=0.3 T, n=10$^{17}$ m$^{-3}$, h=0.1 m and $L_x = L_z = 0.3$ m, the impedance is 200Ω.

It happens that the minority ions in the plasma respond quite differently to the ICRH field than do the majority ions. Specifically, at cyclotron resonance, the reactive part of the response of the minority ions vanishes and the response is determined by the dissipation which results from ion collisions with the gas atoms or the plates. Stated differently, the accelerated ions will reach the substrates that are mounted on the plates before they suffer collisions with gas atoms in the plasma. Therefore, the effective collision time $\tau_c$ is determined by the time it takes for the ions to reach the substrates. This time depends on the position y of the particular ion and its velocity v. The effective collision time is given by the expression:

$$\tau_c[v,y] = [2By/E][1 - v/v_m] \quad [32]$$

Thus, the ions with larger velocities contribute more to the current but the effective collision time is shorter. The average effective collision time $<\tau_c>$ weighted by the velocity is given by the expression:

$$<\tau_c> = By/[3E] \quad [33]$$

Based on expression [33] the current in y-direction is given by;

$$j_y = [e^2 n \, By/3M]\cos[\Omega t + \phi] \quad [34]$$

The power dissipation per unit volume is given by;

$$E_y j_y = [e^2 nBEy/6M] \quad [35]$$

and, the total power $P_{Ic}$ becomes;

$$P_{Ic} = e^2 nBEh^2 L_x L_z/[24M] \quad [36]$$

It is to be appreciated that the total power, $P_{Ic}$, must be equal to the power deposited on the plates by the minority ions. The total flux Γ of the minority ions to the plates is calculated by the formula:

$$\Gamma = nEL_xL_z/B \qquad [37]$$

and the average energy <W> of the ions at the impact is;

$$<W> = e^2B^2h^2/[24M] \qquad [38]$$

The product of the flux $\Gamma$ and the average energy <W> is equal to the ICRH power $P_{IC}$. For example, with B=0.3 T, $L_x=L_z$ 0.3 m, h=0.1 m, n=$10^{16}$ m$^{-3}$, E=200 V/m and argon ions, the flux is 6×$10^{17}$/sec and the power is 86 watt.

The current in the y-direction, $J_y$ (see [34] above), is non-uniform and induces the current in the direction of the magnetic field carried by the electrons to keep the current divergence free. The current density in the z-direction at the walls is given by $$J_z = \pm [e^2nBL_z/6M]\cos[\Omega t + \phi] \qquad [39]$$

where the negative sign applies for 0<y<h/2 and the positive sign applies for h/2<y<h.

Because of the flux of the minority ions to the plates, there is a net loss of the ions from plasma. Thus, in order to keep the charge balance in the plasma, electrons must leave the plasma parallel to the magnetic field and add an additional current with a d.c. component which corresponds to the total flux $\Gamma$ of the minority ion flux to the plates.

With the technical aspects of the present invention set forth above in mind, and in light of the difficulties presently encountered by alternative polishing methods mentioned above, it is an object of the present invention to provide a grazing angle plasma polisher which uses the same environment for both polishing and for a plasma assisted deposition/etching operation. It is another object of the present invention to provide a grazing angle plasma polisher which uses optical measurements for feed back control over the depth and smoothness of the polishing operation. Still another object of the present invention is to provide a grazing angle plasma polisher which can simultaneously polish a plurality of substrate surfaces. Yet another object of the present invention is to provide a grazing angle plasma polisher which is relatively easy to manufacture, operationally simple to use, and comparatively cost effective.

SUMMARY OF THE PREFERRED EMBODIMENTS

A device and method for generating a plasma to polish the surface of a substrate includes a vessel which has a chamber in which the substrate is placed. A gas mixture which is approximately 90% helium and approximately 10% of a minority gas, such as Argon, Neon, Krypton or Xenon, is placed in the chamber. The gas mixture is then heated by electron cyclotron heating (ECH) to produce and maintain a plasma which is held in the vessel chamber at a low gas pressure. As a result of this ECH heating, the majority ions, i.e. the helium ions, stay at low energy levels and provide a stable plasma environment in the vessel chamber.

A substantially homogeneous magnetic field, having a field strength of approximately 0.3 Tesla, is created in the vessel chamber. Importantly, the magnetic field is specifically oriented relative to the substrate surface depending on the nature of the substrate to be polished. In the more common case where the substrate is an electrical conductor, the magnetic field is oriented substantially parallel to the substrate surface. On the other hand, if the substrate is an electrical insulator, the magnetic field is oriented in such a way as to make a small angle with the substrate surface and other consequent adjustments need to be made. As contemplated by the present invention, a Hall probe can be used to establish the orientation of the substrate relative to the magnetic field.

Once the substrate surface is properly oriented relative to the magnetic field, and once the plasma has been generated in the vessel chamber, the minority ions (i.e. ions from the minority gas in the plasma) are accelerated by ion cyclotron resonance heating (ICRH). Specifically, for ICRH, the minority ions are accelerated by r-f radiation from an ICRH antenna that is mounted on the vessel. As is well known, the ICRH r-f radiation will be at a power and frequency which is substantially near the resonant ion cyclotron frequency of the minority ions. For the present invention, the ICRH power for the minority ions will be approximately two hundred watts (200 W). The result is that the minority ions in the plasma are accelerated in directions that are perpendicular to the magnetic field. More specifically, the accelerated minority ions are sent on outwardly expanding spiral trajectories (curved paths) which, under appropriate conditions, will eventually cause the minority ions to collide with the substrate surface and cause sputtering.

As intended for the present invention, collisions between minority ions and the substrate surface preferably occur at grazing angles, $\theta$, which are in a range of 0°–20°. It happens that by slightly detuning the ICRH frequency from resonance, the rate of acceleration of the minority ions decreases before colliding with the substrate surface. This detuning tends to further reduce the grazing angle $\theta$ and thereby enhance the probability the ions will collide with the substrate surface within the desired range.

Due to the grazing angle, $\theta$, the sputtering which results from these collisions tends to remove atoms from the higher protrusions on the substrate surface. The indentation of the surface is in the shadow of the ion orbits and is shielded from sputtering. Thus, the tendency of the sputtering operation is to smooth the substrate surface. In order to improve the uniformity of this sputtering operation, the direction from which the accelerated minority ions collide with the substrate surface can be varied. For example, the substrate can be placed on a rotatable base and rotated relative to the magnetic field. Alternatively, the plasma itself can be further radiated with a low frequency r-f signal and caused to swing back and forth over the substrate surface. In either case, the relative movement between the substrate surface and the plasma in the magnetic field will contribute to a more uniform polishing of the substrate surface. Furthermore, this relative movement, coupled with inherent variations in the collision angles, $\theta$, for each of the individually accelerated ions, will effectively eliminate the so-called ripple effect.

It happens that as atoms are removed from the substrate by sputtering, they are excited by electrons in the plasma and emit characteristic optical emission lines. The intensity of these particular emission lines is proportional to the rate at which material is being removed from the substrate surface. Further, when the substrate surface is rough, the intensity of these emission lines will fluctuate. Thus, by monitoring the intensity and the fluctuations of the emission lines, the progress of the polishing operation can be determined. Additionally, since the minority ions in the plasma emit characteristic optical emission lines at a different wavelength from the emission lines of the substrate material, the density of minority ions in the plasma can also be monitored. To do all of this monitoring, the present invention can incorporate a CCD camera, or a photo diode array, equipped with optical fibers for viewing the various emission lines. With this equipment, both the plasma and the substrate surface can be optically monitored.

In another aspect of the present invention, the need to maintain the ICRH electric field, and the need to return electron current from the plasma, present conflicting requirements for the ICRH antenna installation. On the one hand, the applied ICRH voltage needs to be relatively high to maintain the ICRH electric field. On the other hand, the voltage induced by the electron current should be relatively small. In order to satisfy these conflicting requirements, the present invention employs an antenna/divider. Specifically, the ICRH antenna of the present invention includes at least two antenna elements which are mounted on the vessel across the magnetic field from each other. Each antenna element includes a first and a second electrode with a plurality of individual divider strips positioned between the electrodes. From the perspective of the plasma inside the vessel chamber, the electrodes and divider strips are seen to be separated from each other by an underlying layer of resistive material. Thus, the electron current from the plasma in the vessel chamber sees the ICRH antenna element as a parallel circuit which reduces the voltage produced by the electron current. Behind the resistive layer, however, the electrodes and divider strips are electrically connected in series with each other. Thus, from the perspective of the ICRH power source, which is connected to the electrodes from outside the vessel and behind the resistive layer, the ICRH antenna element is seen as a series circuit which requires the voltage needed to maintain the ICRH electric field.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
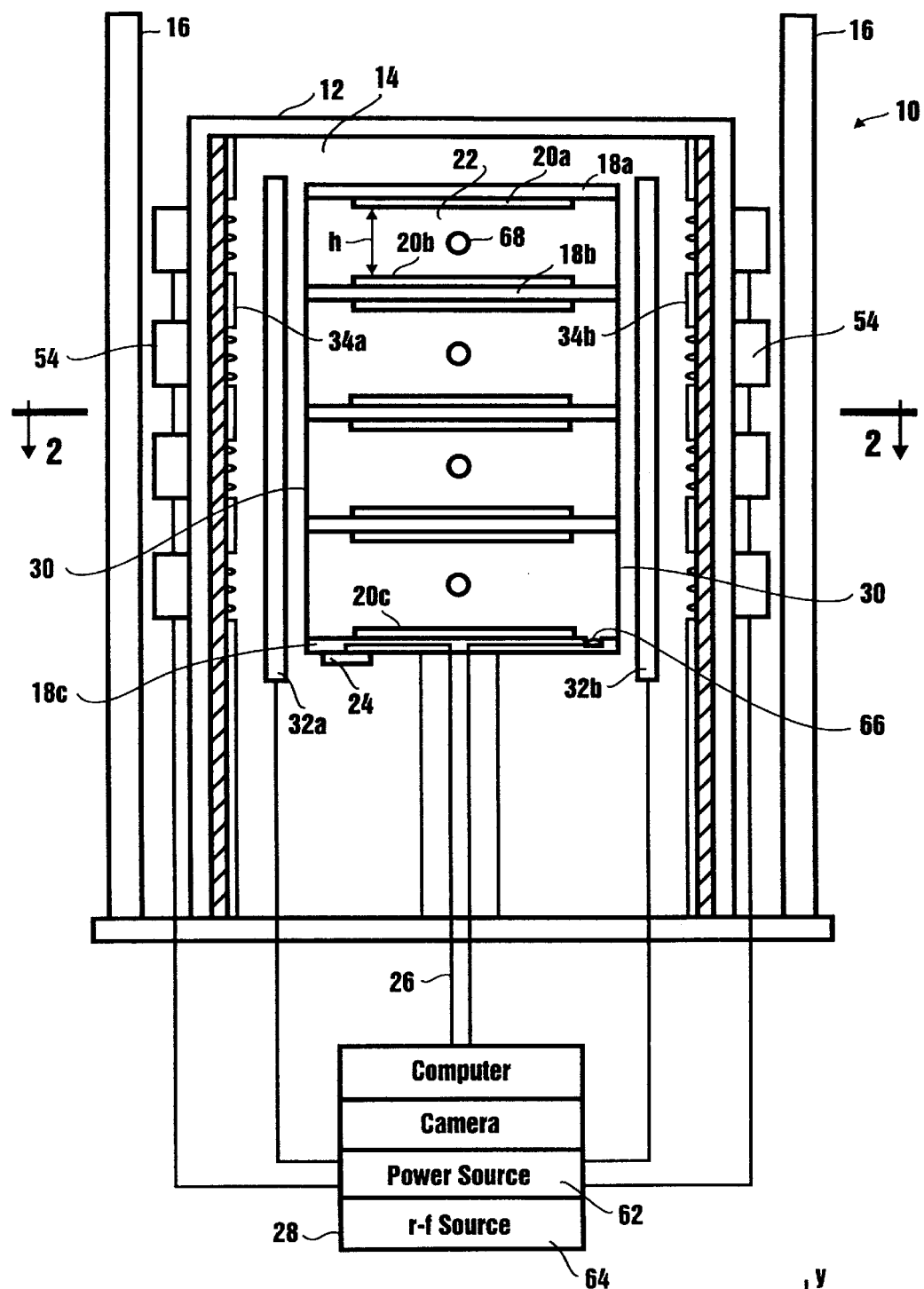
FIG. 1 is a schematic drawing of the device of the present invention.

Referring initially to FIG. 1, a device in accordance with the present invention is shown and generally designated. As shown, the device 10 includes a vessel 12 which is formed with a chamber 14. A magnet system 16, which can comprise Helmholtz coils, a solenoid or a ferromagnet, is positioned to establish a magnetic field in the chamber 14. For purposes of the present invention the magnetic field should be substantially homogeneous and should have a field strength of approximately 0.3 Tesla. It will be appreciated that stronger or weaker field strengths can be used.

FIG. 1 also shows that a plurality of support plates 18 can be mounted inside the chamber 14 of vessel 12. The specifically designated support plates 18a–c are only exemplary. Also shown in FIG. 1 are a plurality of substrates 20 which are individually placed and held on a respective support plate 18. Preferably, as specifically shown for the substrates 20a and 20b, when more than one substrate is to be polished by the device 10 the substrates 20 are arranged in pairs and are positioned opposite from each other across a region 22. In this arrangement the distance between the exposed surfaces of the substrates 20 is a height distance (h) which is in the range of approximately four to twenty inches. Again, for discussion purposes, the substrates 20a–c are only exemplary. Here, the substrate 20a is shown held on the support plate 18a and the substrate 20b is held on the support plate 18b. As will be appreciated by the skilled artisan the supports 18 can be mounted inside the chamber 14 in any manner well known in the art. Importantly, the supports 18 need to be moveable in order to selectively orient the substrates 20 relative to the magnetic field of the magnet 16.

To ensure a proper orientation of the substrates 20 within the magnetic field of the magnet 16, a Hall probe 24 is provided. In FIG. 1 the Hall probe 24 is shown mounted on the support 18c. As also shown in FIG. 1, Hall probe 24 is electrically connected via a line 26 with the control console 28. In the most typical case where the substrate 20 is made of an electrically conductive material, the exposed surface of substrate 20 needs to be oriented parallel to the magnetic field. Thus, using the coordinate system shown with FIG. 1, the magnetic field in region 22 will need to be generally oriented in the Z-direction. This requires the exposed surface of substrate 20 be parallel to the X and Z axes, and perpendicular to the Y axis. If the substrate 20 is made of an insulative material, the substrate 20 can be tilted slightly with respect to the magnetic field to avoid an electric charge build up on the substrate 20. In either case, the orientation of the support plates 18 can be adjusted, as required, from the control console 28 by manipulation of the support posts 30 which connect and hold the individual support plates 18 in the chamber 14.

As intended for the present invention, the chamber 14 of vessel 12 is filled with a gas mixture which, preferably, comprises approximately ninety percent (90%) Helium and approximately ten percent of a minority gas selected from the group comprising Argon, Neon, Krypton or Xenon. This gas mixture is held at a pressure of approximately 0.1 m Torr, and from this gas mixture, a plasma is formed in the chamber 14. Specifically, the plasma is formed by radiating the gas mixture with ECH antenna elements 32a and 32b using a power of approximately six hundred and eighty watts. Power for the ECH antenna 32 is provided from the power source which, for purposes of disclosure, is shown in FIG. 1 to be part of the control console 28. Depending on the nature of the vessel 12, it will be appreciated that the ECH antenna elements 32a and 32b can be placed with inside or outside of the chamber 14.

Figure 2:
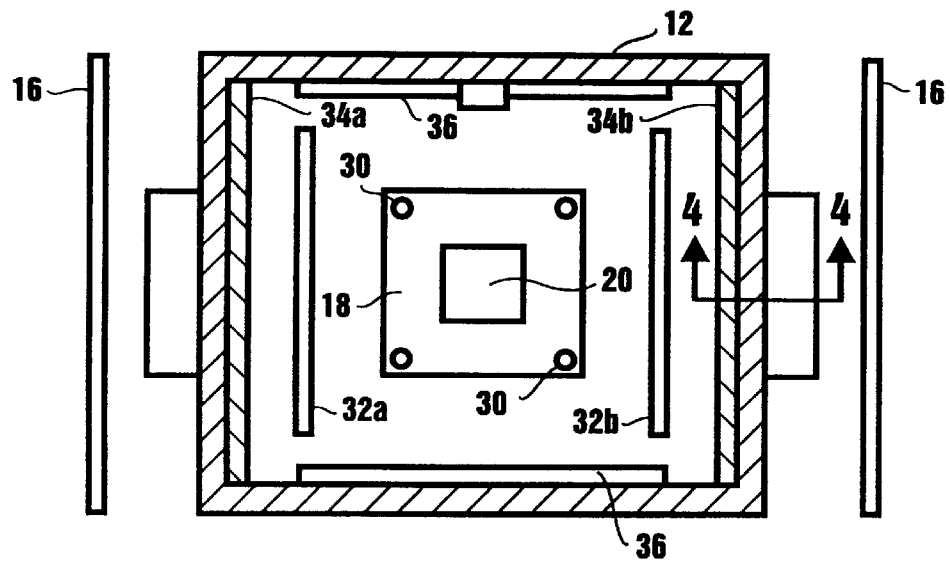
FIG. 2 is a cross-sectional schematic of the device of the present invention as seen along the line 2—2 in FIG. 1.

FIG. 1 also shows that the device 10 includes at least two ICRH antenna elements 34a and 34b which are also powered from the power source of control console 28, and which are diametrically opposed across the region 22 from each other. In a manner disclosed above in detail, these ICRH antenna elements 34a and 34b accelerate the minority ions on trajectories (curved paths) which will cause them to impact with the surface of substrates 20 at a grazing angle θ. Recall from the above disclosure that ion impact with the substrates 20 causes atoms to be removed therefrom. Consequently, the material removed from the substrates 20 must somehow be collected. The getter plates 36, which are perhaps best seen in FIG. 2 are mounted on vessel 12 in chamber 14 for this purpose.

Figure 3:
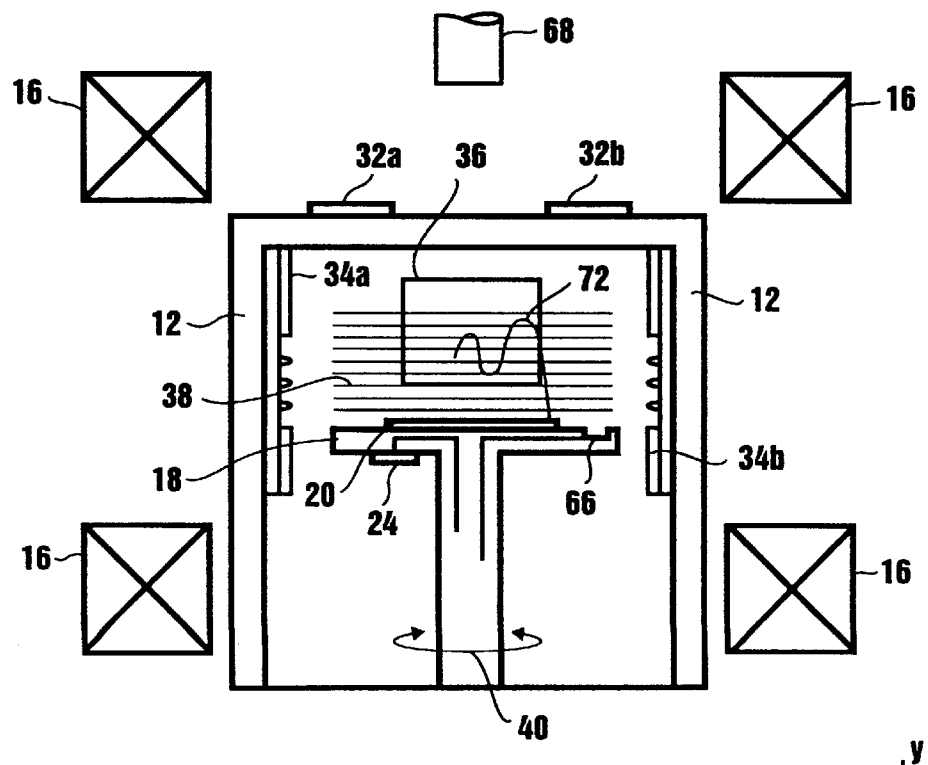
FIG. 3 is a schematic drawing of an alternate embodiment of the device of the present invention.

In FIG. 3, an alternate embodiment of the device 10 is shown wherein only one substrate 20 is to be polished. In all significant particulars, the alternate embodiment for one substrate 20 is essentially the same as for the multi-substrate 20 version shown in FIG. 1. In FIG. 3, however, the magnetic lines 38 of the magnetic field are shown. Also, there is an indication that the support plate 18 can be rotated in the direction indicated by arrow 40. As indicated above, such a rotation may be desirable in order to change the directions from which the accelerated minority ions impact with the substrate 20. The result is to thereby even out any ripple or uneven effect which may occur when the minority ions are directed toward the surface of substrate 20 from only one direction.

Figure 4:
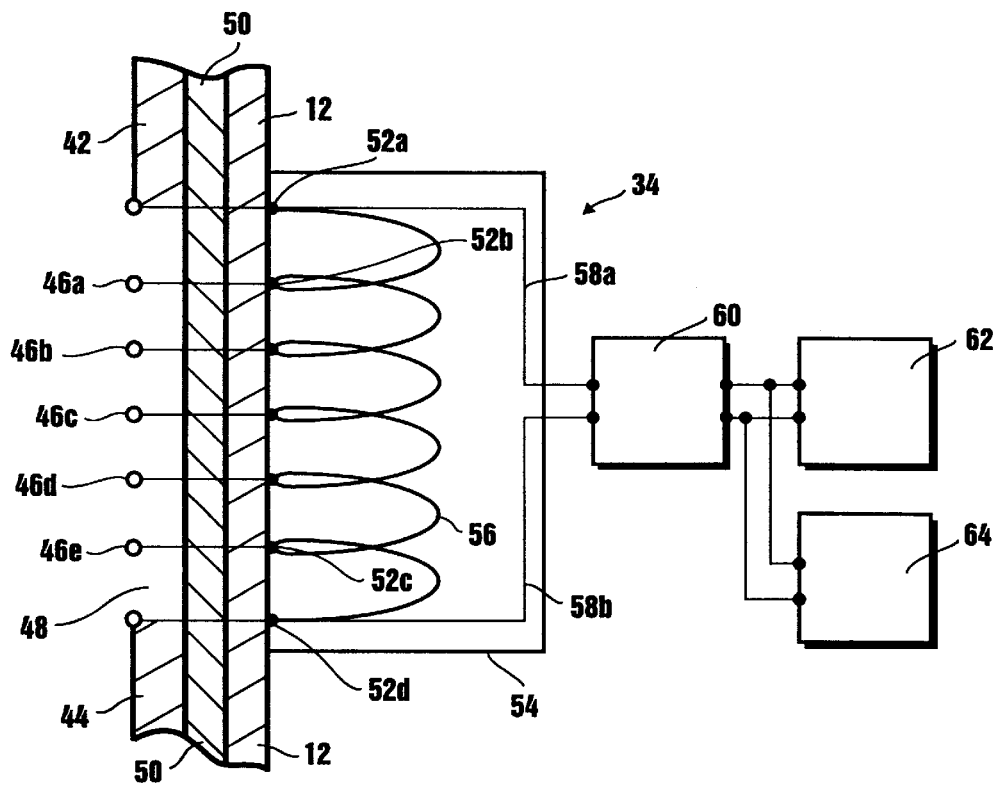
FIG. 4 is a detail cross-sectional schematic of an ICRH antenna element in accordance with the present invention as would be seen along the line 4—4 in FIG. 2.

Although the functionality of the ICRH antenna elements 34a and 34b has been discussed above, a discussion of the particulars for one such element is helpful for a more complete understanding of the importance of the ICRH antenna. In FIG. 4 an ICRH antenna element 34 is shown in a schematic cross-section. There it will be seen that each of the elements 34 includes a first or upper electrode 42 and second or bottom electrode 44. Between the first electrode 42 and the second electrode 44 are a plurality of divider strips 46a–e, of which the strips 46a–e have been identified in the figure. It is seen in FIG. 4 that the divider strips 46a–e are separated from each other by a respective gap 48. Further, the end divider strips 46a and 46e are also separated from the respective electrodes 42 and 44 by a gap 48. For the present invention, the electrodes 42 and 44, as well as the divider strips 46a–e, are preferably made of a refractory metal such as gold, platinum or molybdenum. Further, FIG. 4 shows that the antenna element 34 incorporates a resistive section 50 which is made of a resistive material such as carbon. FIG. 4 also shows that the electrodes 42,44 and the divider strips 46a–e are each individually connected through this resistive section 50 to a respective tap 52a–d. Thus, the electron current from the plasma in the chamber 14 sees the ICRH antenna element as a parallel circuit which requires much less power. The taps 52a–d, as shown, are exemplary.

All of the taps 52a–d are part of an inductive divider 54 (also sometimes referred to as a tapped transformer), and all of the taps 52a–d are connected in series with each other through the line 56. Further, it will be noted that the end tap 52a, which is in contact with the first electrode 42, is also attached to a line 58a. Similarly, the end tap 52d, which is in contact with the second electrode 44, is attached to a line 58b. Thus, via the lines 58a and 58b, there is a series connection between the antenna element 34 and the matching circuitry 60. Thus, with this series connection, it is possible to maintain the voltage required to maintain the ICRH electric field in the chamber 14. As shown in FIG. 4, the matching circuitry 60 is connected directly to both the power source 62 and the low frequency source 64. In FIG. 1, these components are shown as part of the control console 28.

At this point, it should be recognized that two ICRH antenna elements 34 are used for the antenna 34 when a single substrate 20 is being polished (see FIG. 3). On the other hand, multiple pairs of antenna elements 34 are used when a plurality of substrates 20 are being polished. Specifically, one pair of antenna elements 34 are required for each pair of substrates 20 (see FIG. 1).

Both FIGS. 1 and 3 show that the device 10 may include an ion collector 66 which is mounted on a support plate 18 to monitor the flux of minority ions to the substrate. Also, FIGS. 1 and 3 show that an optical monitor 68 can be mounted on the vessel 12 to detect line emissions as sputtered atoms from the surface of substrate 20 are excited by plasma electrons. The optical monitor 68 can be of any type well known in the art such as optical fibers which transport the line emission image to a CCD or an array of photodiodes. These components are generically identified as the camera of control console 28.

Operation

In the operation of the device 10 of the present invention, at least one substrate 20 is positioned on a support plate 18 in the chamber 14 of vessel 12. a gas mixture of about 90% helium and 10% of a minority gas are then pumped into the chamber 14. Once the chamber 14 has been filled with the gas mixture, the ECH antenna 32 is activated to create a plasma in the chamber 14. The control console 28, in accordance with signals received from the Hall probe 24, orients the surface of substrate 20 relative to the magnetic field. Under the influence of the magnetic field from magnet system 16, the plasma is magnetically insulated from the substrate 20.

After the plasma has been generated in the chamber 14, the ICRH antenna is activated to accelerate the minority ions in the plasma.

Figure 5:
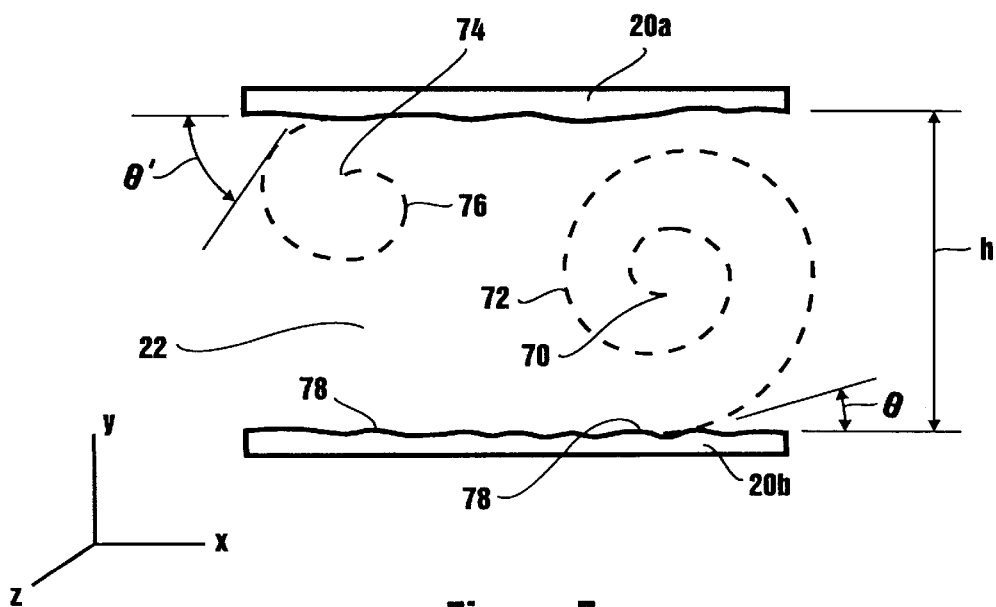
FIG. 5 is a schematic drawing of a minority ion trajectory which results from ICRH.

In FIG. 5, typical trajectories for accelerated minority ions are shown. For the ion 70, its trajectory 72 takes it into collision with the substrate 20b. Depending on its distance from the substrate 20b, the impact angle θ, may or may not be in the desired range of 0°–20°. For comparison purposes, the trajectory 72 is shown viewed from the z direction in FIG. 5, and from the x direction in FIG. 3, with FIG. 3 accounting from movement of the ion in the direction of the magnetic field. Further, depending on the relation of its start point with h/2, the ion 70 will collide with either substrate 20a or 20b. For instance, the ion 74 is shown with a trajectory 76 which has caused it to collide with the substrate 20a at an impact angle of θ'. In FIG. 5 it can be seen that impact angles in the range of 0°–20° are most likely to cause the sputtering of protrusions 78 on the surface of the substrate 20a and 20b. Thus, substrates 20a and 20b are polished.

As discussed above, the ICRH antenna can be slightly detuned from the resonance frequency to further reduce impact angle θ. The degree of detuning is optimized by monitoring signals at the control console 28 that are received from the ion collector 66.

Progress in the polishing of substrate 20 is determined by observing line emissions from the plasma. As indicated above, this is done with a camera in the control console 28 which is optically connected to and optical monitor 68 mounted in the chamber 14. More specifically, the intensity of these line emissions is monitored to determine the rate at which material is being removed from the substrate 20, and fluctuations in the line emissions are monitored as a measure of the smoothness which has been attained for the surface of the substrate 20. In accordance with preprogrammed parameters in the computer of control console 28, the polishing operation can be manually or automatically stopped when the desired smoothness for the surface of substrate 20 has been realized.

While the particular GRAZING ANGLE PLASMA POLISHER (GAPP) as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A device for generating a plasma to polish a surface of a substrate, said plasma including majority ions and minority ions and said device comprising:

a vessel having a chamber for holding a plasma therein;

a magnet for generating a magnetic field in said chamber said magnetic field being directed substantially parallel to said substrate;

a support for holding said substrate in said chamber in a selected orientation relative to said magnetic field; and an ICRH antenna for radiating said plasma in said chamber with r-f power substantially near the resonant ion cyclotron frequency of said minority ions in said plasma, to selectively accelerate said minority ions of said plasma on a curved path toward said substrate surface for collision therewith at a grazing angle $\theta$, said grazing angle $\theta$ being in the range of from zero to approximately twenty degrees (0°–20°) relative to said substrate surface, to polish said substrate surface by removing atoms from said substrate surface.

2. A device as recited in claim 1 further comprising an optical system for measuring emission line intensities and fluctuation of atoms removed from said substrate surface to determine progress in substrate polishing, said emission line intensities being indicative of rates of removal of said atoms from said substrate surface and said emission line fluctuations being indicative of substrate surface roughness.

3. A device as recited in claim 2 wherein said optical system includes a video camera for viewing said emission line intensities and fluctuations.

4. A device as recited in claim 2 wherein said optical system includes a photo diode array for viewing said emission line intensities and fluctuations.

5. A device as recited in claim 2 wherein said emission line intensities and fluctuations are used as feedback signals for controlling radiations of r-f power and frequency from said antenna and to stop radiations of r-f power and frequency from said antenna when said substrate surface has been polished.

6. A device as recited in claim 1 further comprising means for rotating said substrate on said support in said chamber to reduce inhomogeneities in said substrate surface.

7. A device as recited in claim 1 further comprising a low frequency r-f power source to oscillate plasma ions parallel to said substrate surface to reduce inhomogeneities on said substrate surface during polishing.

8. A device as recited in claim 7 wherein said magnet generates a substantially homogeneous magnetic field having a strength of approximately 0.3 Tesla.

9. A device as recited in claim 7 further comprising a Hall probe mounted on said support for creating signals used to orient said substrate surface relative to said magnetic field of said magnet.

10. A device as recited in claim 9 wherein said substrate surface is oriented substantially parallel to said magnetic field of said magnet.

11. A device as recited in claim 9 further comprising means for using said signals to tilt said substrate surface relative to said magnetic field to neutralize any charge build-up on said substrate surface.

12. A device as recited in claim 1 wherein said plasma is generated from a gas mixture containing approximately ninety percent Helium and approximately ten percent Argon for generating minority ions in said plasma (90% He and 10% Ar).

13. A device as recited in claim 1 wherein said plasma is generated from a gas mixture containing approximately ninety percent Helium and approximately ten percent Neon for generating minority ions in said plasma (90% He and 10% Ne).

14. A device as recited in claim 1 further comprising means for establishing said r-f power at a frequency substantially in resonance with cyclotron frequency of said minority ions at approximately two hundred watts (200 W).

15. A device as recited in claim 1 further comprising a plurality of getter plates for adsorbing atoms removed from said substrate surface.

16. A device as recited in claim 1 further comprising an ion collector mounted on said support to provide signals for adjusting said frequency of said r-f power radiated by said antenna.

17. A device as recited in claim 1 further comprising a means for determining said ion cyclotron frequency from resonance to control a reduction in acceleration of ions for reducing said grazing angle $\theta$.

18. A device as recited in claim 1 wherein said support holds a plurality of said substrates.

19. A method for using a plasma to polish a surface of a substrate, said plasma including both majority ions and minority ions and said method comprising the steps of:

providing a vessel having a chamber;

introducing a gas mixture into said chamber at a pressure of approximately 0.1 m Torr;

generating a magnetic field in said chamber, said magnetic field having a field strength of approximately 0.3 Tesla;

selectively orienting said substrate in said chamber relative to said magnetic field;

producing a plasma with ions in said chamber using said gas mixture; and accelerating ions with an ICRH antenna by radiating said plasma in said chamber with r-f power substantially near the resonant ion cyclotron frequency of said minority ions in said plasma, to selectively accelerate said minority ions on a curved path toward said substrate surface for collision therewith at a grazing angle $\theta$, said grazing angle $\theta$ being in the range of from zero to approximately twenty degrees (0°–20°) relative to said substrate surface, to polish said substrate by removing atoms from said substrate surface.

20. A method as recited in claim 19 further comprising the step of detuning from said resonant ion cyclotron frequency to control a reduction in acceleration of said ions for reducing said grazing angle $\theta$.

21. A method as recited in claim 19 further comprising the steps of:

measuring emission line characteristics of said atoms removed from said substrate surface to determine progress in substrate polishing, said emission line characteristics being intensities indicative of rates of removal of said atoms from said substrate surface and fluctuations indicative of substrate surface roughness; and stopping said radiating step when said emission line characteristics indicate said substrate surface has been polished.

22. A method as recited in claim 19 wherein said gas mixture comprises approximately 90% Helium and approximately 10% a minority gas and wherein said producing step includes generating minority ions in said plasma from said minority gas for radiation with r-f power at said substantially resonant ion cyclotron frequency of said minority ions to accelerate said minority ions toward said substrate surface.

23. A method as recited in claim 22 wherein said minority gas is selected from a group comprising Argon, Neon, Krypton and Xenon.

24. A method as recited in claim 19 further comprising the step of rotating said substrate on said support in said chamber to reduce inhomogeneities in said substrate surface.

25. A method as recited in claim 19 further comprising the step of tilting said substrate surface relative to said magnetic field to neutralize any charge build-up on said substrate surface.

26. A device for generating a plasma to polish a surface of a substrate which comprises:

a vessel having a chamber for holding a plasma therein;

a magnet for generating a magnetic field in said chamber;

a support for holding said substrate in said chamber in a selected orientation relative to said magnetic field; and an ion accelerator for accelerating ions of said plasma on a curved path toward said substrate surface for collision therewith at a grazing angle $\theta$ to polish said substrate surface by removing atoms from said substrate surface, wherein said ion accelerator is an antenna for radiating said plasma in said chamber with r-f power substantially near the resonant ion cyclotron frequency of said ions, and wherein said antenna comprises a pair of opposed elements mounted on said vessel and each said element comprises a resistive layer mounted on said vessel in said chamber, a first electrode mounted on said resistive layer, a second electrode mounted on said resistive layer, a plurality of divider strips mounted on said resistive layer between said first electrode and said second electrode, and an inductive divider connected to said first electrode, said second electrode, and to each of said divider strips.

27. A device as recited in claim 26 further comprising a power source connected to said first electrode and said second electrode for generating said r-f power.

* * * * *